United States Patent
Wang et al.

(10) Patent No.: US 6,214,714 B1
(45) Date of Patent: Apr. 10, 2001

(54) METHOD OF TITANIUM/TITANIUM NITRIDE INTEGRATION

(75) Inventors: Shulin Wang, Campbell; Ming Xi, Milpitas; Zvi Lando, Palo Alto; Mei Chang, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/344,825

(22) Filed: Jun. 25, 1999

(51) Int. Cl.$^7$ ................................ H01L 21/3205
(52) U.S. Cl. ................ 438/592; 438/584; 438/635; 438/636; 438/648; 438/649; 438/653; 438/683; 438/643
(58) Field of Search ................ 438/584, 635, 438/636, 648, 649, 653, 683, 643, 592

(56) References Cited

U.S. PATENT DOCUMENTS

| | | | |
|---|---|---|---|
| 4,960,732 | * 10/1990 | Dixit et al. | 437/192 |
| 5,240,739 | 8/1993 | Doan et al. | 427/126.1 |
| 5,320,880 | 6/1994 | Sandhu et al. | 427/578 |
| 5,332,689 | 7/1994 | Sandhu et al. | 437/109 |
| 5,344,792 | 9/1994 | Sandhu et al. | 437/200 |
| 5,376,405 | 12/1994 | Doan et al. | 427/126.1 |
| 5,378,660 | 1/1995 | Ngan et al. | 437/247 |
| 5,652,181 | 7/1997 | Thakur | 437/192 |
| 5,960,303 | * 9/1999 | Hill | 438/592 |
| 5,972,785 | * 10/1999 | Shishinguchi et al. | 438/592 |
| 5,994,775 | * 11/1999 | Zhao et al. | 257/751 |
| 5,998,871 | * 12/1999 | Urabe | 257/754 |
| 6,013,310 | * 1/2000 | Yaoi et al. | 427/96 |
| 6,071,552 | * 6/2000 | Ku | 427/99 |

FOREIGN PATENT DOCUMENTS 10-209278 * 8/1998 (JP) ................ H01L/21/768

OTHER PUBLICATIONS

"Effect of NH3 Plasma Treatment on Etching of Ti During TiCl4–Based TIN CVD Processes", M. E. Gross et al., Mat. Res. Soc. Symp. Proc., vol. 514, 1998, pp. 523–529.

"Chemical Vapor Deposition of Titanium Nitride at Low Temperatures" S. R. Kurtz and R. G. Gordon, Thin Solid Films, vol. 40, 1986.

"Contact Plug Formed with Chemical–Vapour–Deposited TiN", K. Mori et al., Extended Abstracts of the 1991 Int. Conf. on Solid State Devices and Materials, Yokohama, 1991, pp. 210–212.

* cited by examiner

Primary Examiner—Matthew Smith
Assistant Examiner—V. Yevsikov
(74) Attorney, Agent, or Firm—Thomason, Moser & Patterson

(57) ABSTRACT

A method of film processing comprises forming an integrated titanium/titanium nitride (Ti/TiN) film structure having an intermediate layer. The intermediate layer comprises species containing Si, and preferably containing Si and Ti, such as titanium silicide ($TiSi_x$), or $TiSi_xO_y$, among others. The intermediate layer protects the underlying Ti film against chemical attack during subsequent TiN deposition using a titanium tetrachloride ($TiCl_4$)-based chemistry. The method allows reliable Ti/TiN film integration to be achieved with excellent TiN step coverage. For example, the film structure can be used as an effective barrier layer in integrated circuit fabrication.

19 Claims, 3 Drawing Sheets

METHOD OF TITANIUM/TITANIUM NITRIDE INTEGRATION

BACKGROUND OF THE DISCLOSURE

1. Field of the Invention

The invention relates to a method of thin film processing and, more particularly, to a method of forming an integrated titanium/titanium nitride film structure.

2. Description of the Background Art

In the manufacture of integrated circuits, a titanium nitride film is often used as a metal barrier layer to inhibit the diffusion of metals into an underlying material beneath the barrier layer. These underlying materials form transistor gates, capacitor dielectrics, semiconductor substrates, metal lines, and many other structures that appear in integrated circuits.

For example, when an electrode is being formed for a transistor's gate, a diffusion barrier is often formed between the gate electrode and a metal that serves as the contact portion of the electrode. The diffusion barrier inhibits the diffusion of the metal into the gate electrode material, which may be composed of polysilicon. Such metal diffusion is undesirable because it would change the characteristics of the transistor, or render it inoperative. A combination of titanium/titanium nitride (Ti/TiN), for example, is often used as a diffusion barrier.

The Ti/TiN stack has also been used to provide contacts to the source and drain of a transistor. For example, in a tungsten (W) plug process, a Ti layer is deposited upon a silicon (Si) substrate, followed by conversion of the Ti layer into titanium silicide ($TiSi_x$), which provides a lower resistance contact with Si. A TiN layer is then formed upon the $TiSi_x$ layer, prior to forming the tungsten plug. In addition to being a barrier layer, the TiN layer serves two additional functions: 1) prevents chemical attack of $TiSi_x$ by tungsten hexafluoride ($WF_6$) during W deposition; and 2) acts as a glue layer to promote adhesion of the W plug.

Ti and TiN films can be formed by physical or chemical vapor deposition. A Ti/TiN combination layer may be formed in a multiple chamber "cluster tool" by depositing a Ti film in one chamber followed by TiN film deposition in another chamber without exposing the Ti film to the atmosphere, i.e., an integrated Ti/TiN deposition process. When depositing both Ti and TiN using chemical vapor deposition (CVD), titanium tetrachloride ($TiCl_4$), for example, may be used to form both Ti and TiN films when allowed to react with different reactant gases, e.g., hydrogen ($H_2$) for Ti deposition under plasma condition, and ammonia ($NH_3$) for TiN thermal deposition.

However, when a $TiCl_4$-based chemistry is used in such an integrated Ti/TiN film deposition process, a reliability problem is encountered. In particular, the integrated Ti/TiN stack structure tends to either peel off or exhibit a haze, which may result, for example, from $TiCl_4$ or other species arising from $TiCl_4$, chemically attacking the Ti film prior to TiN deposition.

Therefore, there is a need in the art for methods of Ti/TiN process integration having improved film characteristics.

SUMMARY OF THE INVENTION

The present invention relates to a method of forming a film structure (i.e., a film stack) comprising titanium (Ti) and titanium nitride (TiN) films. In particular, the method comprises forming an intermediate protective layer containing silicon (Si), preferably comprising Si and Ti, upon a Ti layer, followed by deposition of a TiN layer upon the intermediate layer.

The intermediate layer may comprise titanium silicide ($TiSi_x$), or some other "alloyed" species arising from a reaction between Ti and Si, including $TiSi_xO_y$, among others. The intermediate layer protects the underlying Ti layer from chemical attack during subsequent TiN layer deposition using a $TiCl_4$-based chemistry.

The protective layer comprising $TiSi_x$ is formed, for example, by depositing an amorphous silicon or polysilicon film upon the Ti layer, followed by annealing the Si and Ti films at an elevated temperature. Reaction between the Si film and a top portion of the Ti layer leads to the formation of the protective layer upon the Ti layer. Alternatively, the intermediate protective layer may also be formed by directly depositing $TiSi_x$ from a reaction between titanium tetrachloride ($TiCl_4$) and silane ($SiH_4$).

TiN is subsequently formed upon the intermediate layer using, for example, a reaction between titanium tetrachloride ($TiCl_4$) and ammonia ($NH_3$). The intermediate layer protects the underlying Ti layer, such that chemical attack of the Ti layer during TiN deposition is mitigated. The method results in the formation of a conformal TiN layer over the underlying structure, and provides an alternative approach to reliable Ti/TiN process integration in integrated circuit fabrication.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention is a method for titanium (Ti)/titanium nitride (TiN) process integration, which results in a Ti/TiN stack with improved reliability and good step coverage for the TiN layer. In particular, the method comprises forming a protective layer comprising silicon (Si), and preferably comprising Si and Ti—e.g., titanium silicide ($TiSi_x$), between the Ti and TiN layers. The use of the intermediate $TiSi_x$ protective layer allows the TiN layer to be formed under process conditions optimized for both film characteristics and step coverage. In general, the intermediate protective layer may also comprise, aside from $TiSi_x$, other species arising from a reaction between Ti and Si, such as $TiSi_xO_y$, or other species containing Ti and Si elements. These Si- and Ti-containing species will be referred generally as "Ti—Si alloyed" species.

In one embodiment, the protective layer comprising Ti—Si alloyed species is formed by depositing a Si film upon the Ti layer, followed by exposing the layers to a high temperature, e.g., about 600° C. Depending on the specific process sequence, the conversion of the Si film into the "Ti—Si alloyed" protective layer may be performed during the Si deposition step, or in a subsequent high temperature process step. For example, if Si is deposited from silane at about 600° C. or higher, the Ti—Si alloyed intermediate layer will be formed during Si deposition. However, if the Si layer is deposited from disilane at about 500° C., a subsequent step at about 600° C. or higher is required to form the Ti—Si alloyed protective layer. This may be done either as a separate annealing step, or during subsequent TiN thermal deposition. Alternatively, a protective layer comprising $TiSi_x$ may be formed directly upon the Ti layer, for example, by using a reaction between $TiCl_4$ and a silicon-containing gas, such as silane ($SiH_4$) or disilane ($Si_2H_6$). One of the advantages of incorporating a layer containing Ti—Si alloyed species or $TiSi_x$ in this integration technique is the process and chemical compatibility with both Ti and TiN deposition.

Wafer Processing System

Figure 1:
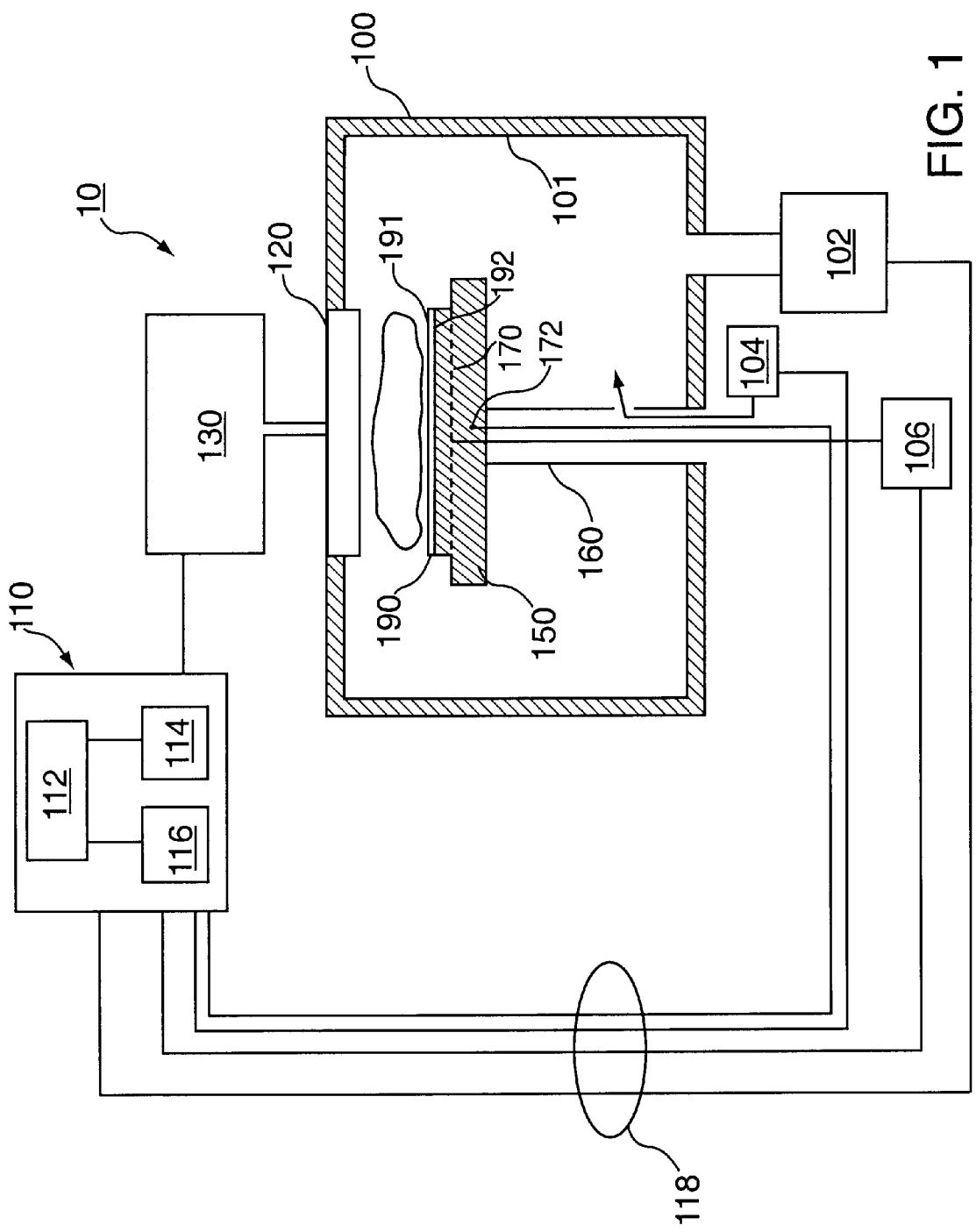
FIG. 1 depicts a schematic illustration of an apparatus that can be used for the practice of this invention.

FIG. 1 depicts schematically a wafer processing system 10 that can be used to practice embodiments of the present invention. The system 10 comprises a process chamber 100, a gas panel 130, a control unit 110, along with other hardware components such as power supplies 106 and vacuum pumps 102. One example of the process chamber 100 is a TiN chamber, which has previously been described in a commonly-assigned U.S. patent application entitled "High Temperature Chemical Vapor Deposition Chamber," Ser. No. 09/211,998, filed on Dec. 14, 1998, and is herein incorporated by reference. Some key features of the system 10 are briefly described below.

Chamber 100

The process chamber 100 generally comprises a support pedestal 150, which is used to support a substrate such as a semiconductor wafer 190 within the process chamber 100. This pedestal 150 can typically be moved in a vertical direction inside the chamber 100 using a displacement mechanism (not shown). Depending on the specific process, the wafer substrate 190 has to be heated to some desired temperature prior to processing. In the illustrative chamber, the wafer support pedestal 150 is heated by an embedded heater 170. For example, the pedestal 150 may be resistively heated by applying an electric current from an AC supply 106 to the heater element 170. The wafer 190 is, in turn, heated by the pedestal 150, and can be maintained within a process temperature range of, for example, 450–750° C. A temperature sensor 172, such as a thermocouple, is also embedded in the wafer support pedestal 150 to monitor the temperature of the pedestal 150 in a conventional manner. For example, the measured temperature may be used in a feedback loop to control the power supply 106 for the eating element 170 such that the wafer temperature can be maintained or controlled at a desired temperature which is suitable for the particular process application.

Proper control and regulation of the gas flows through the gas panel 130 is performed by mass flow controllers (not shown) and a controller unit 110 such as a computer. The showerhead 120 allows process gases from the gas panel 130 to be uniformly distributed and introduced into the chamber 100. Illustratively, the control unit 110 comprises a central processing unit (CPU) 112, support circuitry 114 that contains memories for storing associated control software 116. This control unit 110 is responsible for automated control of the numerous steps required for wafer processing—such as wafer transport, gas flow control, temperature control, chamber evacuation, and so on. Bi-directional communications between the control unit 110 and the various components of the system 10 are handled through numerous signal cables collectively referred to as signal buses 118, some of which are illustrated in FIG. 1.

A vacuum pump 102 is used to evacuate the process chamber 100 and to maintain the proper gas flows and pressure inside the chamber 100. A showerhead 120, through which process gases are introduced into the chamber 100, is located above the wafer support pedestal 150. The "dual-gas" showerhead 120 used in the present invention has two separate pathways or gas lines, which allow two gases to be separately introduced into the chamber 100 without premixing. Details of the showerhead 120 have been disclosed in a commonly-assigned U.S. patent application entitled "Dual Gas Faceplate for a Showerhead in a Semiconductor Wafer Processing System," Ser. No. 09/098,969, filed Jun. 16, 1998; and is herein incorporated by reference. This showerhead 120 is connected to a gas panel 130 which controls and supplies, through mass flow controllers (not shown), various gases used in different steps of the process sequence. During wafer processing, a purge gas supply 104 also provides a purge gas, for example, an inert gas, around the bottom of the pedestal 150 to minimize undesirable deposits from forming on the pedestal 150.

Ti/TiN Film Integration

Figure 2A:
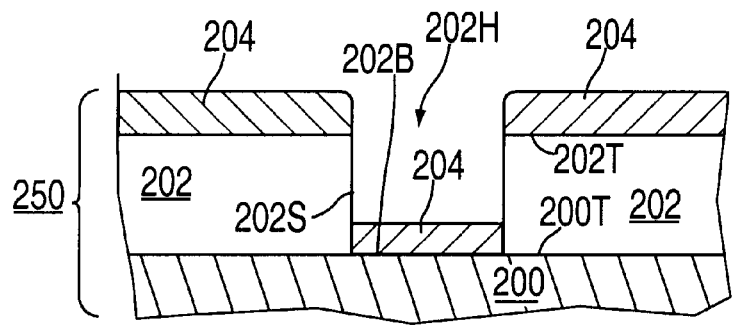
FIGS. 2a–2d depict schematic cross-sectional views of a substrate at different stages of film processing according to one embodiment of the present invention.
Figure 2B:
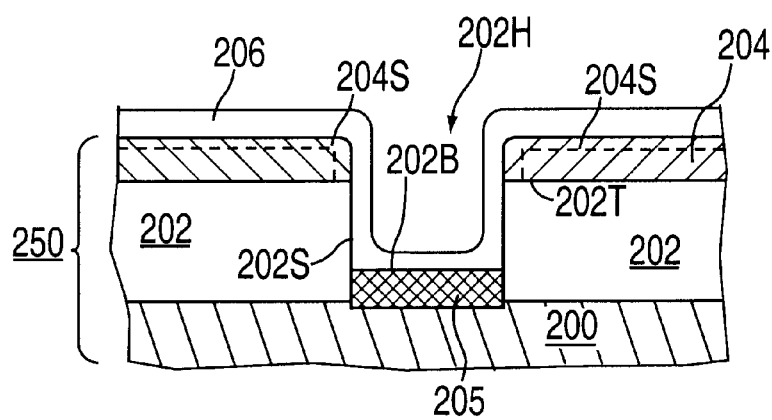
Figure 2C:
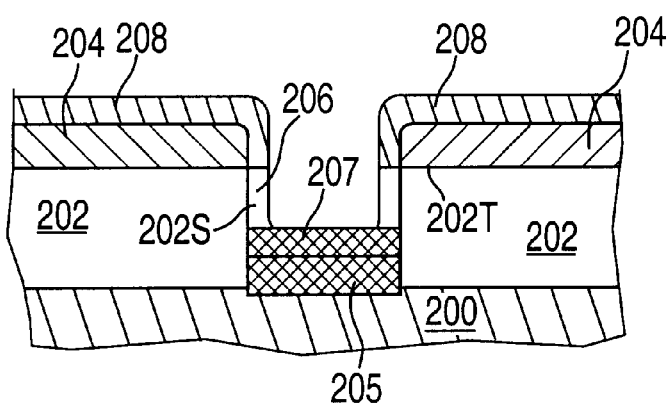

FIGS. 2a–2c illustrate one preferred embodiment of the present invention. In general, the substrate 200 refers to any workpiece upon which film processing is performed, and a substrate structure 250 is used to generally denote the substrate 200 together with other material layers formed upon the substrate 200. Depending on the specific stage of processing, the substrate 200 may be a silicon semiconductor wafer, or other material layer which has been formed upon the wafer. FIG. 2a, for example, shows a cross-sectional view of a substrate structure 250, having a Ti film 204 (the words "film" and "layer" are used interchangeably) upon a material layer 202 which has previously be formed upon a silicon wafer substrate 200. In this particular illustration, the material layer 202 may be an oxide (e.g., $SiO_2$), which has been conventionally formed and patterned to provide a contact hole 202H extending to the top surface 200T of the substrate 200. The Ti film 204 may be deposited upon the substrate structure 250 by a conventional Ti deposition process such as plasma enhanced chemical vapor deposition (PECVD) or physical vapor deposition (PVD).

The deposited Ti film 204 also contacts a portion of the substrate 200 at the bottom 202B of the contact hole 202H. Due to the non-conformal nature of the plasma deposited Ti film 204, the sidewall 202S of the contact hole 202H is not covered by any Ti. If the Ti deposition is performed using PECVD, typically at a high temperature between 600–700° C., a reaction will occur between the Ti film 204 and the silicon substrate 200 at the bottom 202B of the contact hole 202H. This leads to the formation of a titanium silicide ($TiSi_x$) layer 205, as shown in FIG. 2b. Alternatively, if the Ti film 204 is deposited using PVD, then the $TiSi_x$ layer 205 at the bottom 202B of the contact hole 202H may be formed in a separate rapid thermal process step, either prior to or during subsequent film processing. While the method of Ti film deposition is not critical to the practice of the present invention, the property of the Ti film 204, e.g., surface roughness, may affect the choice of process conditions used in subsequent film deposition.

After the Ti film 204 is formed, a thin Si film 206 (e.g., amorphous or polysilicon) is deposited upon the Ti film 204 at a high temperature, as shown in FIG. 2b. The Si deposition, for example, can be performed by thermal CVD using precursor gases such as $SiH_4$ or disilane ($Si_2H_6$) in chambers that are used for Ti or TiN deposition. The Si film 206 can typically be formed in a precursor flow range of between 20 to 200 sccm, a pressure range of 5 to 20 torr and a temperature range of about 500 to 700° C. For the precursor gas $SiH_4$, however, a temperature range of 600–700° C. is preferred. When the process is performed in a chamber 100 having a dual-gas showerhead 120 such as that depicted in FIG. 1, dilutant gases are supplied to the chamber 100 via both gas lines (not shown) of the showerhead 120. In one embodiment, for example, a $N_2$ dilutant gas flow of 1–10 slm is established, along with $SiH_4$, in one gas line; while an inert gas such as $N_2$ or He is supplied in the second gas line at a flow range of 1–10 slm. The gas flow in the second gas line is selected primarily to minimize potential "back flow" of gases into the gas line, and may comprise one or more inert gases. Other gases, such as hydrogen ($H_2$) and argon (Ar), among others, may also be used, as long as they are compatible with Si CVD deposition from $SiH_4$. More preferably, silicon deposition is performed at a total pressure of about 10 torr and a pedestal temperature of about 680° C., with about 50 sccm of $SiH_4$ flow and about 2000 sccm of $N_2$ in one gas line, and a $N_2$ flow of about 1000 sccm and a He flow of 1000 sccm in the other. An inert purge gas flow (e.g., Ar) of about 1000 sccm is also provided from a purge gas supply 104 (see FIG. 1) to minimize undesirable deposits from forming on the pedestal 150.

The thickness of the Si film 206 required for forming an effective intermediate protective layer depends on the surface roughness of the underlying Ti film 204, which in turn is dependent on the Ti film thickness. In general, a thicker Ti film 204 has a larger surface roughness, and a correspondingly thicker Si layer 206 is needed. Since the deposited Si layer 206 has excellent step coverage, a thickness of about 20 Å is typically sufficient for a 150 Å thick Ti film 204. The Si film 206 is subsequently allowed to react with a surface layer 204S (delineated by a dashed line in FIG. 2b) of the underlying Ti layer 204, by annealing at a high temperature, e.g., over 600° C. The reaction results in the formation of an intermediate layer 208, shown in FIG. 2c, which may comprise $TiSi_x$, $TiSi_xO_y$, or other "alloyed" species containing Ti and Si (where x and y denote generally respective amounts of Si and O relative to Ti). In this illustration, the intermediate layer 208 may also comprise $TiSi_xO_y$ because the oxide layer 202 provides a source of oxygen. In other embodiments without an oxygen source, $TiSi_xO_y$ will not be formed in the intermediate layer 208. Instead, other "Ti—Si alloyed" species may be present, depending on the specific substrate structure 250. The formation of the intermediate layer 208 from the Si layer 206 may either occur as a separate process step, or as part of a subsequent TiN deposition step. For example, when the substrate structure 250 shown in FIG. 2b is positioned onto the heated pedestal 150 of the processing chamber 100, which is maintained at over 600° C., a reaction between the Si film 206 and the Ti surface layer 204S will occur. Typically, a 20 Å thick Si film 206 will result in an intermediate layer 208 of about 50 Å. During the high temperature anneal, a reaction also occurs between the Si layer 206 lying over the $TiSi_x$ layer 205, resulting in the formation of another layer 207 of $TiSi_x$. The remaining Si film 206 adjacent the sidewall 202S will not significantly affect the contact resistance.

Figure 2D:
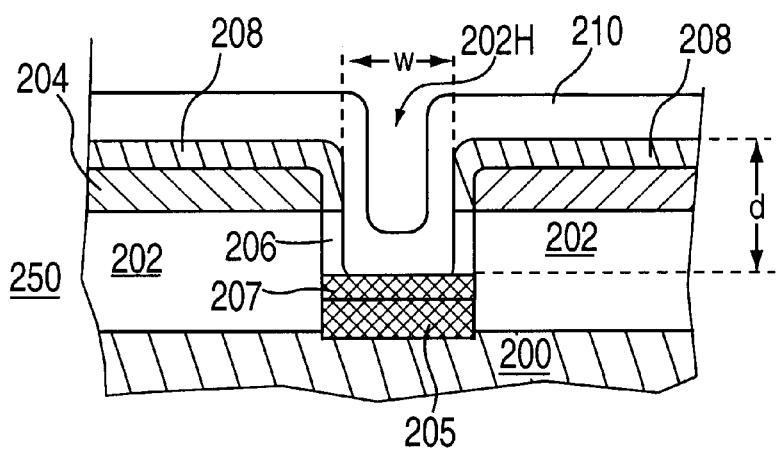

After the formation of the intermediate protective layer 208, processing continues with the deposition of the TiN film 210, as illustrated in FIG. 2d. The TiN film 210 can be formed, for example, by CVD using a reaction of $TiCl_4$ and $NH_3$ in the chamber 100 of FIG. 1. In one embodiment, helium (He) and nitrogen ($N_2$) are introduced into the chamber 100, along with $TiCl_4$, via one pathway (gas line) of the showerhead 120. $NH_3$, along with $N_2$, is introduced into the chamber 100 via the second pathway of the showerhead 120. He and $N_2$ are generally referred to as "dilutant" gases, and argon (Ar) or other inert gases, may also be used, either singly or in combination (i.e., as a gas mixture) within either gas line of the showerhead 120. A bottom inert gas purge flow (e.g., Ar) of about 2000 sccm is also established through a separate gas line and gas supply 104 provided at the bottom of the chamber 100. Typically, the reaction can be performed at a $TiCl_4$ vapor flow rate of 5–40 sccm with a He gas flow of 500–2000 sccm and $N_2$ flow of 500–5000 sccm, $NH_3$ flow rate of 50–500 sccm with $N_2$ flow of 500–5000 sccm, a total pressure range of 3–30 torr and a pedestal temperature over 600° C. (e.g., 600–700° C.). Alternatively, a $TiCl_4$:$NH_3$ vapor flow ratio in the range of about 0.1–0.5 is also acceptable. More preferably, the TiN film 210 is deposited at a $TiCl_4$ vapor flow rate of about 20 sccm (about 170 mg/min. liquid flow rate) in about 1000 sccm He and 1000 sccm $N_2$, $NH_3$ flow rate of about 100 sccm with $N_2$ at about 2000 sccm, a total pressure of about 10 torr and a temperature of about 680° C. Under these process conditions, the TiN film 210 exhibits a step coverage of at least 95% for an aspect ratio of about 3.5:1 (aspect ratio is defined as the ratio between the depth d and the width w of the opening 202H upon which TiN deposition takes place.) The presence of the intermediate layer 208 protects the underlying Ti layer 204 against chemical attack during the subsequent $TiCl_4$-based TiN deposition step. Since $TiSi_x$ (or Ti—Si alloyed species) is chemically compatible with both Ti and TiN, the incorporation of the intermediate layer 208 in the Ti/TiN integration process results a film structure with high reliability, good barrier layer properties and excellent TiN step coverage. In general, the intermediate protective layer of the present invention can be used in conjunction with other $TiCl_4$-based processes for TiN deposition, including for example, plasma-enhanced CVD using $TiCl_4/N_2$, among others.

Figure 3A:
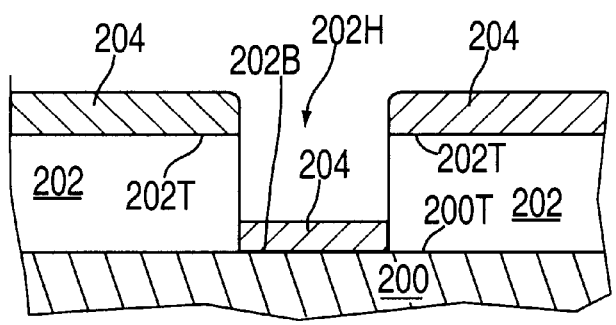
FIGS. 3a–3d depict schematic cross-sectional views of a substrate at different stages of film processing according to another embodiment of the present invention.
Figure 3B:
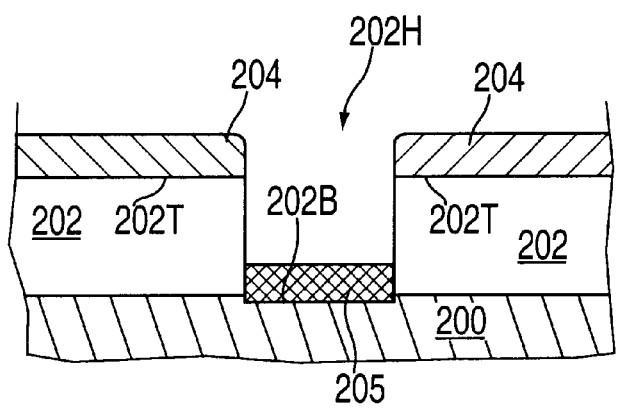

FIGS. 3a–3d illustrate another embodiment of the present invention, showing cross-sectional views of a substrate 200 undergoing different stages of an integrated circuit fabrication sequence. FIG. 3a shows a Ti film 204 upon the underlying patterned material layer 202 and contacting the substrate 200 at the bottom 202B of the contact hole 202H. As previously described in connection with FIG. 2a, the Ti film 204 covers primarily the top 202T of the patterned layer 202 and the bottom 202B of the contact hole 202H. In one illustrative embodiment, the Ti film 204 may be formed by PVD, in which case, the Ti film 204 at the bottom 202B of the contact hole 202H can be converted into a $TiSi_x$ layer 205 in a subsequent high temperature (e.g., over 600° C.) step, as shown in FIG. 3b.

Figure 3C:
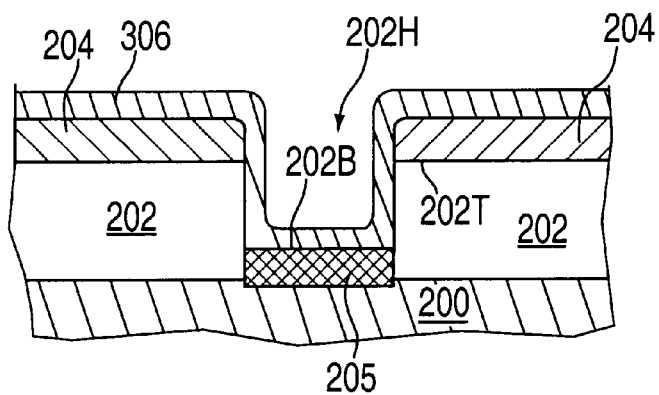

FIG. 3c shows a protective layer 306 formed upon the Ti film 204 and the $TiSi_x$ layer 205. The protective layer 306 may comprise, for example, titanium silicide ($TiSi_x$) or other Ti—Si "alloyed" species such as $TiSi_xO_y$, which are effective in preventing attack of the underlying Ti film 204 during subsequent TiN film deposition. In one embodiment of the present invention, the intermediate layer 306, which may comprise primarily $TiSi_x$, is deposited directly upon the Ti film 204 using a reaction between $TiCl_4$ and silane ($SiH_4$) at a temperature range of about 650–750° C., or preferably, at a heater temperature of about 680° C. The reaction can be performed in a process chamber 100 similar to that shown in FIG. 1, in which $TiCl_4$ and $SiH_4$ are separately introduced into the chamber 100 via the dual-gas showerhead 120. The reaction may be performed at a $TiCl_4$ flow range of about 1–5 sccm, $SiH_4$ flow range of 10–50 sccm, and a total pressure range of 1–20 torr. To increase the deposition rate and to reduce the chlorine content in the deposited film, a hydrogen ($H_2$) flow of about 5 slm may be used. Alternatively, other gases comprising the silicon element, e.g., dichlorosilane (SiH$_2$Cl$_2$), may also be used in place of SiH$_4$ to react with TiCl$_4$, and the processing conditions can be adjusted to suit specific needs. The protective TiSi$_x$ layer 306 may, for example, have a thickness from 20 to 100 Å, and more preferably, about 50 Å.

Figure 3D:
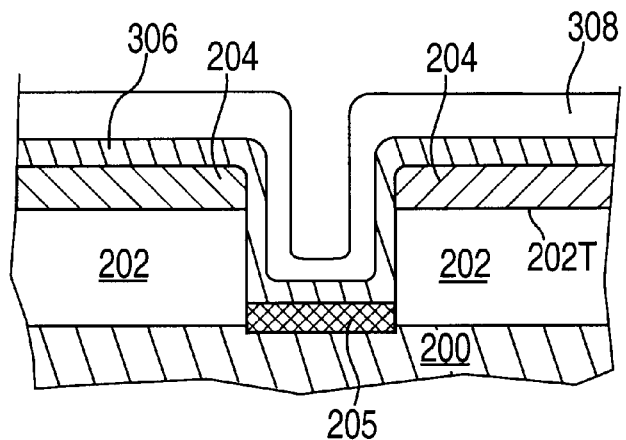

After the formation of the intermediate layer 306, a TiN layer 308 is deposited upon the protective layer 306, as illustrated in FIG. 3d. The deposition of TiN layer 308 has previously been described in connection with FIG. 2d.

Thereafter, a W plug (not shown) is formed upon the TiN layer 308 of FIG. 3d or the TiN layer 210 of FIG. 2d, using for example, a reaction between WF$_6$ and H$_2$. Adhesion of the W plug layer is improved by the presence of the TiN glue layer.

The specific process conditions disclosed in the above discussion are meant for illustrative purpose only. Other combinations of process parameters such as precursor and inert gases, flow ranges, pressure and temperature may also be used in forming the integrated Ti/TiN film structure of the present invention, which incorporates an intermediate protective layer containing Ti and Si elements.

Although several preferred embodiments, which incorporate the teachings of the present invention, have been shown and described in detail, those skilled in the art can readily devise many other varied embodiments that still incorporate these teachings.

What is claimed is:

1. A method of thin film deposition for integrated circuit fabrication comprising the steps of:
    (a) forming a titanium film upon a substrate;
    (b) forming an intermediate layer comprising silicon upon said titanium film, wherein said intermediate layer has a thickness from 20 to less than 100 Å; and
    (c) forming a titanium nitride film upon said intermediate layer, wherein the intermediate layer protects the titanium film from chemical attack during titanium nitride film formation.

2. The method of claim 1, wherein said intermediate layer of step (b) further comprises titanium.

3. The method of claim 1, wherein said step (b) comprises the steps of:
    (d) forming a silicon film upon said titanium film; and
    (e) exposing said silicon film and said titanium film to an elevated temperature to cause a reaction between said silicon film and said titanium film to form said intermediate layer.

4. The method of claim 3, wherein said step (d) is performed in the presence of a gas selected from the group of silane (SiH$_4$), disilane (Si$_2$H$_6$) and dichlorosilane (SiCl$_2$H$_2$).

5. The method of claim 3, wherein said step (d) is performed in the presence of SiH$_4$ at a temperature of between 600–700° C.

6. The method of claim 3, wherein said step (d) is performed at a SiH$_4$ flow rate of between 20 to 200 sccm and a pressure of between 5 to 20 torr.

7. The method of claim 3, wherein said step (d) is performed at a SiH$_4$ flow of about 50 sccm, an inert gas flow of at least 1000 sccm, a total pressure of about 10 torr and a temperature of about 680° C.

8. The method of claim 1, wherein said step (b) comprises the step of:
    (f) reacting titanium tetrachloride (TiCl$_4$) with a gas comprising silicon.

9. The method of claim 8, wherein said gas comprising silicon is silane (SiH$_4$) or disilane (Si$_2$H$_6$).

10. The method of claim 8, wherein said step (f) is performed at a TiCl$_4$ flow rate of between 1–5 sccm and a SiH$_4$ flow rate of between 10–50 sccm and a temperature between 650–750° C.

11. The method of claim 1, wherein said step (c) further comprises the step of:
    (g) reacting titanium tetrachloride (TiCl$_4$) with a gas comprising nitrogen element (N).

12. The method of claim 11, wherein said gas comprising nitrogen (N) is ammonia (NH$_3$).

13. The method of claim 12, wherein said step (g) is performed at a TiCl$_4$:NH$_3$ vapor flow ratio of between 0.1–0.5.

14. The method of claim 12, wherein said step (g) is performed at a TiCl$_4$ vapor flow rate range of about 5–40 sccm and an NH$_3$ flow rate range of about 50–500 sccm.

15. A method of forming a barrier layer for use in integrated circuit fabrication, comprising the steps of:
    (a) providing a substrate structure having an oxide layer upon a silicon substrate;
    (b) forming a contact hole extending from a top surface of said oxide layer to a top surface of said silicon substrate;
    (c) forming a titanium (Ti) film on at least portions of said oxide layer and said silicon substrate;
    (d) forming an intermediate layer comprising silicon upon said Ti film, wherein said intermediate layer has a thickness from 20 to less than 100 Å; and
    (e) forming a titanium nitride (TiN) film upon said intermediate layer in the presence of titanium tetrachloride (TiCl$_4$), wherein the intermediate layer protects the titanium film from chemical attack from TiCl$_4$ during titanium nitride film formation.

16. The method of claim 15, wherein said step (d) comprises the steps of:
    (f) forming a silicon film upon said Ti film of step (c); and
    (g) exposing said silicon film and said Ti film to an elevated temperature to cause a reaction between said silicon film and said Ti film to form said intermediate layer.

17. The method of claim 16, wherein said silicon film of step (f) is formed from chemical vapor deposition of silane (SiH$_4$) or disilane (Si$_2$H$_6$).

18. The method of claim 15, wherein said intermediate layer comprises titanium silicide.

19. The method of claim 15, wherein said intermediate layer of step (d) is formed by reacting titanium tetrachloride (TiCl$_4$) with a gas selected from silane or disilane.

* * * * *